United States Patent [19]
Lee

[11] Patent Number: 5,654,927
[45] Date of Patent: Aug. 5, 1997

[54] DATA TRANSMISSION APPARATUS FOR A MEMORY

[75] Inventor: Sang Hyun Lee, Seoul, Rep. of Korea

[73] Assignee: LG Semicon Co., Ltd., Choongcheongbuk-do, Rep. of Korea

[21] Appl. No.: 621,636

[22] Filed: Mar. 26, 1996

[30] Foreign Application Priority Data

Mar. 28, 1995 [KR] Rep. of Korea ............... 6715/1995

[51] Int. Cl.⁶ .................................................. G11C 7/00
[52] U.S. Cl. ..................... 365/203; 365/189.05; 365/233
[58] Field of Search ................................ 365/203, 233, 365/189.05, 182

[56] References Cited

U.S. PATENT DOCUMENTS

| | | | |
|---|---|---|---|
| 4,926,387 | 5/1990 | Madland | 365/233 |
| 4,953,130 | 8/1990 | Houston | 365/203 |
| 5,311,471 | 5/1994 | Matsumoto et al. | 365/189.05 |
| 5,477,484 | 12/1995 | Nakashima | 365/182 |

*Primary Examiner*—David C. Nelms
*Assistant Examiner*—H. Nguyen
*Attorney, Agent, or Firm*—Morgan, Lewis and Bockius LLP

[57] ABSTRACT

A data transmission apparatus for a memory comprises precharging means for precharging a data bus, the precharging means being enabled by a first control signal outputted from a first externally connected element before data is transmitted to the data bus; a first inverter for inverting data applied thereto and for transmitting the inverted data to the data bus, the first inverter being enabled by a second control signal outputted from a second externally connected element when the precharging of the data bus by the precharging means is completed; a second inverter for inverting the data transmitted to the data bus by the first inverter, the second inverter being enabled by the second control signal; and data stabilizing means for stabilizing the data inverted by the second inverter and for transmitting the stabilized data to a third externally connected element.

6 Claims, 6 Drawing Sheets

DATA TRANSMISSION APPARATUS FOR A MEMORY

FIELD OF THE INVENTION

The present invention relates to a data transmission apparatus, and more particularly, to a data transmission apparatus for a memory.

DISCUSSION OF THE RELATED ART

Figure 1:
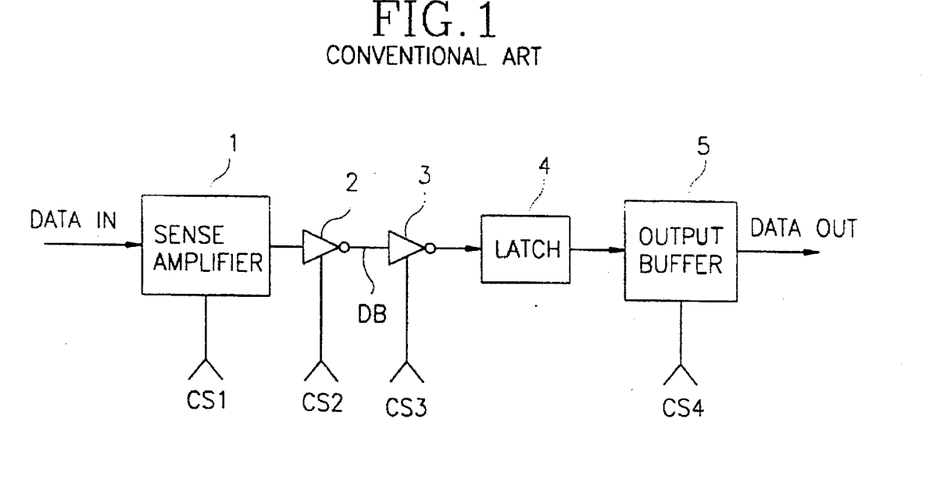
FIG. 1 is a block diagram of a conventional data transmission apparatus for a memory.

As shown in FIG. 1, a conventional data transmission apparatus for a memory includes a sense amplifier 1 for amplifying data DATA IN applied thereto in accordance with a first control signal CS1 outputted from an externally connected element. A first inverter 2 inverts the data outputted from the sense amplifier 1, in accordance with a second control signal CS2 outputted from an externally converted element, a predetermined time after the first control signal CS1 is applied to the first inverter 2 and outputs the inverted data to a data bus DB. A second inverter 3 inverts the data outputted from the first inverter 2 to the data bus DB in accordance with a third control signal CS3 outputted from an externally connected element a predetermined time after the second control signal CS2 is applied to the first inverter 2. A latch 4 temporarily stores the data outputted from the second inverter 3. An output buffer 5 buffers the data outputted from the latch and outputs buffered data DATA OUT in accordance with a fourth control signal CS4. The fourth control signal CS4 is output from an externally connected element a predetermined time after the third control signal CS3 is applied to the third inverter 3.

Operation of the conventional data transmission apparatus will now be explained with reference to FIGS. 2A through 2F.

Figure 2A:
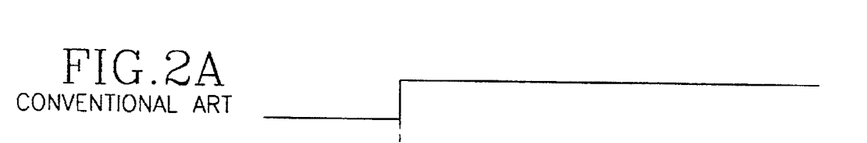
FIGS. 2A through 2F are timing diagrams each showing an operational timing of an element of FIG. 1.

Initially, the sense amplifier 1 is enabled by the first control signal CS1 having a high level voltage shown in FIG. 2A. Thereafter, the data DATA IN outputted from a bit line (not shown) is amplified by a predetermined level in accordance with the first control signal CS1.

Figure 2B:
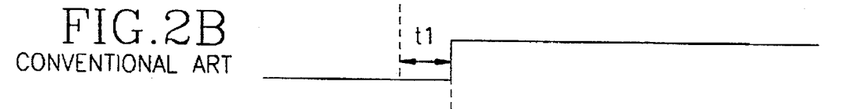

Thereafter, the first inverter 2 is enabled by the second control signal CS2 having a high level voltage, shown in FIG. 2B, which is inputted thereto a predetermined time t1 after the first control signal CS1 is applied to the sense amplifier 1. The first inverter 2 inverts the data outputted from the sense amplifier 1 and transmits the inverted data to the data bus DB.

Figure 2C:
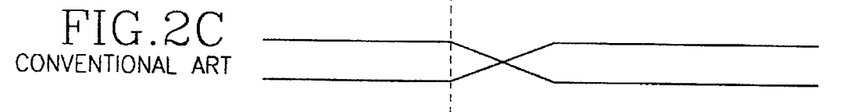
Figure 2D:
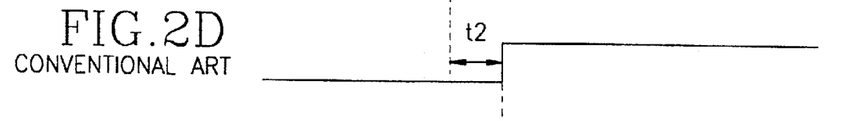
Figure 2E:
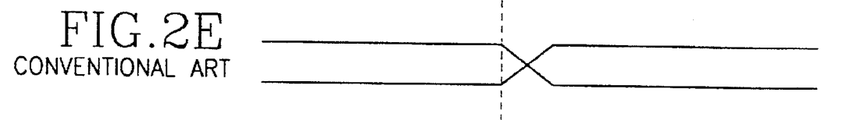

As shown in FIG. 2C, when the data in the data bus DB is transferred from a low level voltage to a high level voltage and after a time t2 to reach a cross point in which a mid-level voltage is provided, a third control signal CS3 having a high voltage level is applied to a control terminal of the second inverter 3. The third control signal CS3 is from an element external to the data transmission apparatus of the memory.

Here, the time t2 is the longest out of the total lapsed time which is required to transmit the data stored in a memory cell to an externally connected element of a memory. The time t2 is the longest because the data storing capacity of the data bus DB is large.

Figure 2F:
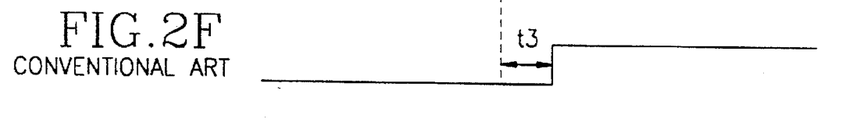

As the third control signal CS3 having a high level voltage is applied to a control terminal of the second inverter 3, the second inverter 3 is enabled. The second inverter 3 inverts the data from the first inverter 2 and transmits the inverted data to the latch 4. The latch 4 temporarily stores the data from the second inverter 3 and outputs the data in a form shown in FIG. 2E. When the data is transferred from a high level voltage to a low level voltage or from a low level voltage to a high level voltage, a predetermined time t3 is needed as shown in FIG. 2F. After the time t3, the fourth control signal CS4 having a high level voltage is applied to the output buffer 5. Thereafter, the output buffer 5 is enabled by the fourth control signal CS4 having the high level voltage. The output buffer 5 buffers the data outputted from the latch 4 and outputs the buffered data DATA OUT.

Moreover, the conventional data transmission apparatus has certain drawbacks. For example, it takes a relatively long time, i.e., t1+t2+t3, to transmit the data stored in a memory cell to an externally connected element of the memory.

SUMMARY OF THE INVENTION

Accordingly, the present invention is directed to a data transmission apparatus for a memory that substantially obviates one or more of the problems due to the limitations and disadvantages of the related art.

An object of the present invention is the provision of a data transmission apparatus for a memory capable of transmitting data previously stored in the memory at a high speed by reducing the delay time which is caused when the data previously stored in a memory cell is transmitted to the outside of the memory by precharging the data bus before a data signal is transmitted to the data bus.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described herein, a data transmission apparatus for a memory of the present invention includes precharging means for precharging a data bus, the precharging means being enabled by a first control signal outputted from a first externally connected element before data is transmitted to the data bus; a first inverter for inverting data applied thereto and for transmitting the inverted data to the data bus, the first inverter being enabled by a second control signal outputted from a second externally connected element when the precharging of the data bus by the precharging means is completed; a second inverter for inverting the data transmitted to the data bus by the first inverter, the second inverter being enabled by the second control signal; and data stabilizing means for stabilizing the data inverted by the second inverter and for transmitting the stabilized data to a third externally connected element.

In another aspect, the data transmission apparatus for a memory includes a first inverter for inverting inputted data before the inputted data is transmitted to a data bus; first switching means, switched by a first control signal outputted from a first externally connected element, for pre-charging the data bus by transmitting the data inverted by the first inverter to the data bus; second switching means, switched by a second control signal outputted from a second externally connected element when the precharging of the data bus by the first switching means is completed, for transmitting data outputted through a second inverter to the data bus; and data stabilizing means, coupled to the second switching means and enabled by the second control signal, for transmitting data to a third externally connected element by stabilizing data outputted from the data bus.

In a further aspect, the data transmission apparatus for transmitting data from a memory to an externally connected element along a data bus includes precharging means for precharging the data bus; first inverting means for inverting the data upon completion of the precharging of the data bus by the precharging means; and second inverting means for inverting the data inverted by the first inverting means.

It is to be understood that both the foregoing general explanation and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the preferred embodiments of the present invention, examples of which are illustrated in the accompanying drawings.

Figure 3:
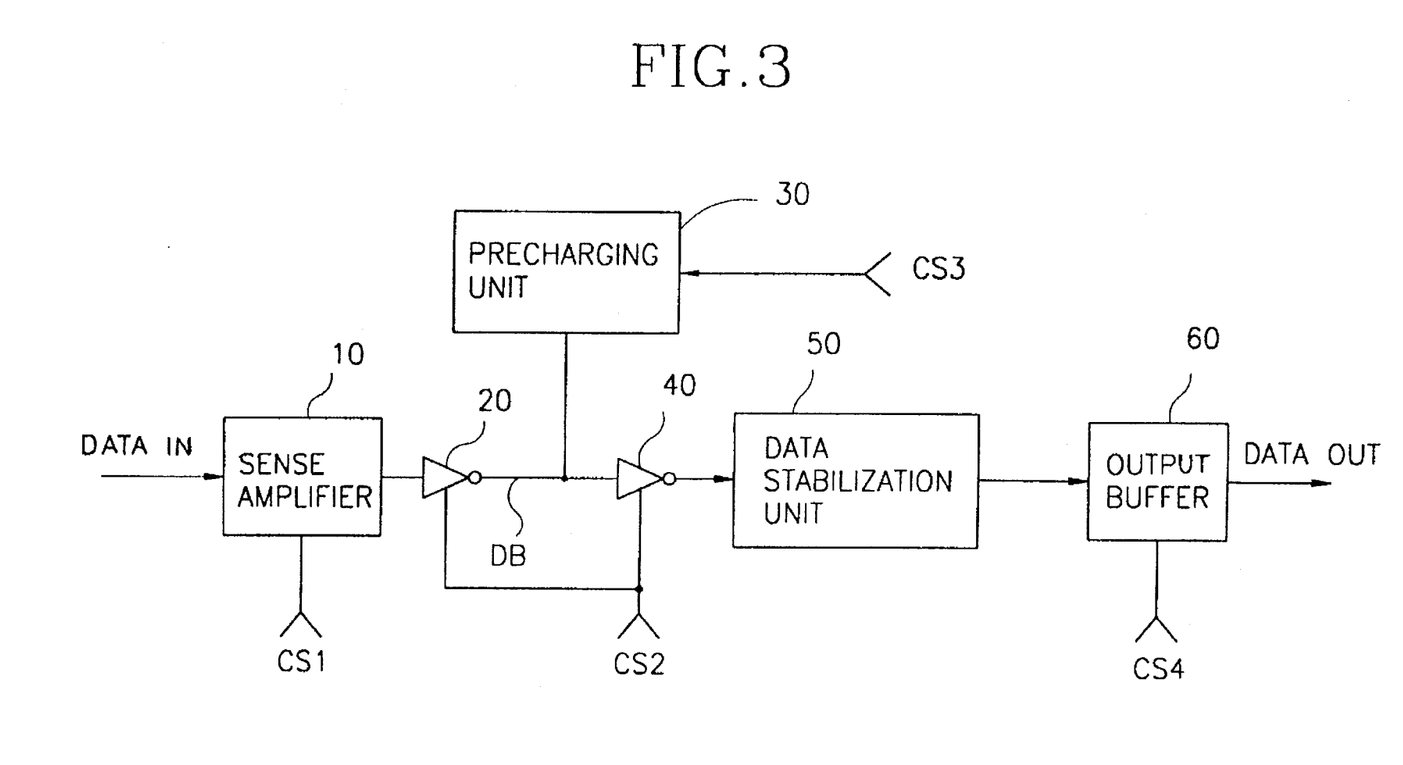
FIG. 3 is a block diagram of a data transmission apparatus for a memory according to a first embodiment of the present invention.

As shown in FIG. 3, a data transmission apparatus for a memory according to a first embodiment of the present invention includes a sense amplifier 10 enabled by a first control signal CS1, which is outputted by an externally connected element, for amplifying data DATA IN inputted thereto. A first inverter 20 inverts the data outputted by the sense amplifier 10 and outputs the inverted data to a data bus DB. The first inverter 20 is enabled by a second control signal CS2, which is outputted by an externally connected element a predetermined time after the first control signal CS1 is applied to the sense amplifier 10. A precharging unit 30, enabled by a third control signal CS3 from an externally connected element before the first inverter 20 is enabled, precharges the data bus DB. A second inverter 40 inverts the data from the data bus DB and is enabled by a second control signal CS2, which is applied to the first inverter 20. A data stabilizing unit 50 including a Schmitt trigger 50a (FIG. 4) stabilizes the data outputted from the second inverter 40. An output buffer 60 buffers the data outputted from the data stabilizing unit 50 and outputs bufferred data DATA OUT.

Figure 4:
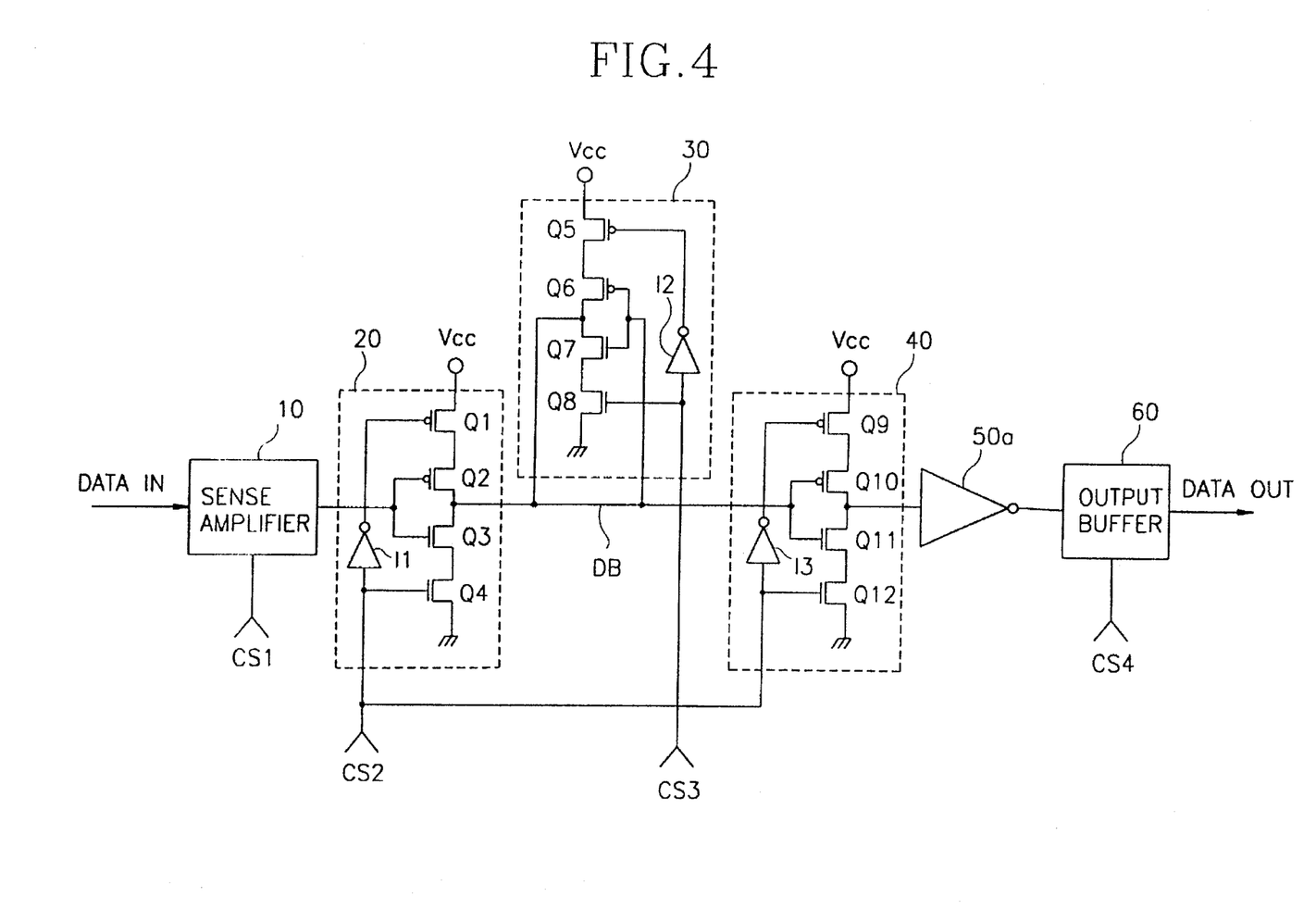
FIG. 4 is a block diagram of each unit of FIG. 3 according to the present invention.

As shown in FIG. 4, the first inverter 20 includes a PMOS transistor Q1 in which a gate terminal thereof is connected to an output terminal of an inverter I1, and a source terminal thereof is connected to a power voltage terminal VCC; a PMOS transistor Q2 and NMOS transistor Q3 in which gate terminals are commonly connected to an output terminal of the sense amplifier 10, and drain terminals are commonly connected to the data bus DB; and an NMOS transistor Q4 in which a gate terminal thereof is connected to an input terminal of the inverter I1, and a drain terminal thereof is connected to a source terminal of the NMOS transistor Q3, and a source terminal thereof is grounded.

The precharging circuit 30 includes a PMOS transistor Q5 in which a gate terminal thereof is connected to an output terminal of an inverter I2, and a source terminal thereof is connected to a power voltage VCC; a PMOS transistor Q6 and an NMOS transistor Q7 in which gate terminals are commonly connected to the data bus DB, and a source terminal (of Q6) thereof is connected to a drain terminal of the PMOS transistor Q5, and drain terminals are commonly connected to the data bus DB; and an NMOS transistor Q8 in which a gate terminal thereof is connected to an input terminal of the inverter I2, and a drain terminal thereof is connected to a source terminal of the NMOS transistor Q7, and a source terminal thereof is grounded.

The second inverter 40 includes a PMOS transistor Q9 in which a gate terminal thereof is connected to an output terminal of an inverter I3, and a source terminal thereof is connected to a power voltage VCC; a PMOS transistor Q10 and an NMOS transistor Q11 in which gate terminals are commonly connected to the data bus DB, a source terminal (of Q10) thereof is connected to a drain terminal of the PMOS transistor Q9, and drain terminals are commonly connected to an input terminal of the data stabilizing unit 50; and an NMOS transistor Q12 in which a gate terminal thereof is connected to an input terminal of the inverter I3, a drain terminal thereof is connected to a source terminal of the NMOS transistor Q11, and a source terminal thereof is grounded.

The data stabilizing unit 50 includes a Schmitt trigger 50a.

Operation of the data transmission apparatus for a memory according to the first embodiment of the present invention will now be explained with reference to FIG. 5.

Figure 5A:
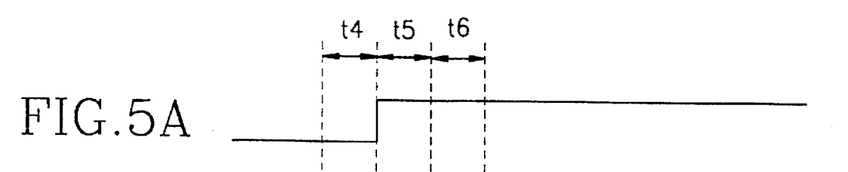
FIGS. 5A through 5F are timing diagrams each showing an operational timing of an element of FIG. 3.

To begin with, during a predetermined time t4, when the first control signal CS1 having a low level voltage, shown in FIG. 5A, is applied to the sense amplifier 10, the sense amplifier 10 is disabled by the first control signal CS1 having a low level voltage applied thereto and cuts off the data DATA IN.

In the first inverter 20, the second control signal CS2 having a low level voltage is applied to an input terminal of the inverter I1 and a gate terminal of the NMOS transistor Q4. A high level voltage from the inverter I1 is applied to a gate of the PMOS transistor Q1. Hence, the PMOS transistor Q1 and the NMOS transistor Q4 are both turned off. Therefore, irrespective of the data commonly inputted to the gates of the PMOS transistor Q2 and NMOS transistor Q3, the common output terminals of the PMOS transistor Q2 and NMOS transistor Q3 maintain a high impedance state.

The third control signal CS3 having a high level voltage is applied to an input terminal of the inverter I2 and a gate of the NMOS transistor Q8 in the precharging unit 30, so that the PMOS transistor Q5 and the NMOS transistor Q8 are turned on, respectively. The PMOS transistor Q5 is turned on since a low level voltage from the inverter I2 is applied to a gate terminal of the PMOS transistor Q5. In addition, data with low level voltage is applied to the PMOS transistor Q6 and the NMOS transistor Q7 in the precharging unit 30, respectively.

Here, when the data just before the data bus DB is a low level voltage, the PMOS transistor Q6 is turned on, and the NMOS transistor Q7 is turned off. To the contrary, when the data just before the data bus DB is a high level voltage, the PMOS transistor Q6 is turned off, and the NMOS transistor Q7 is turned on.

Figure 5B:
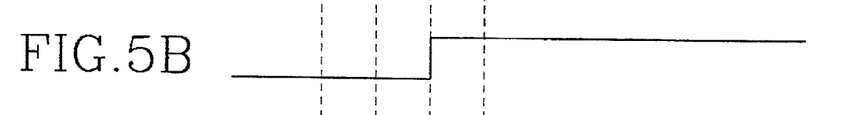
Figure 5C:
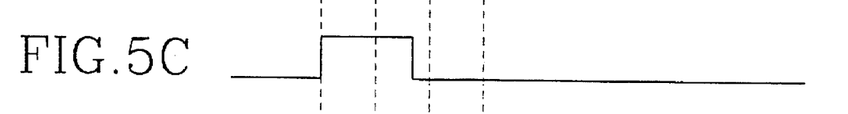
Figure 5D:
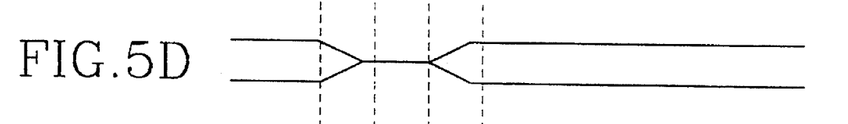

As shown in FIG. 5D, in the precharging unit 30, since the output voltage and the input terminal voltage are the same, and since the mid-level voltage VCC/2, where a characteristic curve of an inverter and a curve under a condition of the input voltage being equal to the output voltage intersect with each other, is applied to the data bus DB, the data in the data bus is transferred to an intermediate state irrespective of the previous state thereof.

Meanwhile, in the second inverter 40, the second inverter 40, and the second control signal CS2 having a low level voltage is applied to an input terminal of the inverter I3 and a gate of the NMOS transistor Q12. A high level voltage inverted by the inverter I3 is applied to a gate of the PMOS transistor Q9. Hence, the PMOS transistor Q9 and the NMOS transistor Q12 are turned off, respectively. Therefore, the commonly connected output terminals of the PMOS transistor Q10 and the NMOS transistor Q11 maintain a high impedance state.

During a predetermined time t5, as shown in FIG. 5A, after the first control signal CS1 having a high level voltage is applied to the sense amplifier 10, the sense amplifier 10 is enabled and amplifies data inputted thereto by a predetermined level. Meanwhile, as shown in FIG. 5C, during a predetermined time t5, the third control signal CS3, which is applied to the precharging unit 30, is transferred from a high level voltage to a low level voltage. The operation of the precharging unit 30 when the third control signal CS3 with a low level voltage is applied to the precharging unit 30 is explained below.

Initially, the third control signal CS3 having a low level voltage is inverted by the inverter I2 and a high level voltage is applied to a gate terminal of transistor Q5. The third control signal CS3 having the low level voltage is applied to a gate terminal of the NMOS transistor Q8. Hence, the PMOS transistor Q5 and the NMOS transistor Q8 are turned off, respectively. Therefore, irrespective of the state of the data applied to the gate terminals of the PMOS transistor Q6 and the NMOS transistor Q7, high impedance data is applied to the data bus DB through the common output terminals of the PMOS transistor Q6 and the NMOS transistor Q7, so that the data in the data bus DB maintains an intermediate state level voltage, as shown in FIG. 5D.

In addition, the second control signal CS2 commonly applied to the control terminals of the first and second inverters 20 and 40 maintains a low level voltage, as shown in FIG. 5B. The description of the operation of the first and second inverters 20 and 40 is omitted because it has been previously described.

The operation of the data transmission apparatus for a predetermined time t6 as shown in FIG. 5 will now be explained.

The first control signal CS1 having a high level voltage as shown in FIG. 5A is applied to the detection amplifying circuit 10, and the detection amplifying circuit 10 amplifies the data DATA IN inputted thereto by a predetermined level. The second control signal CS2 having a high level voltage as shown in FIG. 5B is inverted by the inverter I1 and a low level voltage is applied to the gate terminal of the PMOS transistor Q1. In addition, the second control signal CS2 having the high level voltage is applied to the input terminal of the inverter I1 and the gate terminal of the NMOS transistor Q4. Hence, both the PMOS transistor Q1 and the NMOS transistor Q4 are turned on.

In addition, the PMOS transistor Q2 and the NMOS transistor Q3 receive a data signal having low or high level voltage from the detection amplifying circuit 10. Here, when the data signal having a low level voltage is commonly applied to the gate terminals of the PMOS transistor Q2 and the NMOS transistor Q3, the PMOS transistor Q2 is turned on and the NMOS transistor Q3 is turned off. Hence, a data signal having a high level voltage is transmitted to the data bus through the commonly connected output terminals between the PMOS transistor Q2 and the NMOS transistor Q3. Moreover, when the data signal having a high level voltage is commonly applied to the gate terminals of the PMOS transistor Q2 and the NMOS transistor Q3, the PMOS transistor Q2 is turned off, and the NMOS transistor Q3 is turned on. Hence, a data signal having a low level voltage (since Q4 is turned on) is outputted to the data bus DB through the commonly connected output terminals between the PMOS transistor Q2 and the NMOS transistor Q3.

The third control signal CS3 having a low level voltage as shown in FIG. 5C is applied to the precharging circuit 30. Here, the operation of the precharging circuit 30 will be omitted because it has been previously described.

Moreover, the second control signal CS2 having a high level voltage as shown in FIG. 5B is inverted by the inverter I3, and a low level voltage is applied to the gate terminal of the PMOS transistor Q9. The second control signal CS2 having the high level voltage is applied to the input terminal of the inverter I3 and the gate terminal of the NMOS transistor Q12. Hence, the PMOS transistor Q9 and the NMOS transistor Q12 are turned on. As shown in FIG. 5D, the data signal having a high or low level voltage is commonly applied to each gate terminal of the PMOS transistor Q10 and the NMOS transistor Q11.

Here, when the data signal having a high level voltage is applied to the gate terminals of the PMOS transistor Q10 and the NMOS transistor Q11, the PMOS transistor Q10 is turned off, and the NMOS transistor Q11 is turned on. Thus, the data signal having a low level voltage is outputted through the commonly connected output terminal between the PMOS transistor Q10 and the NMOS transistor Q11. Moreover, when the data signal having a low level voltage is applied to the gate terminals of the PMOS transistor Q10 and the NMOS transistor Q11, the PMOS transistor Q10 is turned on, and the NMOS transistor Q11 is turned off. Thus, the data signal having a high level voltage is outputted through the commonly connected output terminals between the PMOS transistor Q10 and the NMOS transistor Q11.

Figure 5E:
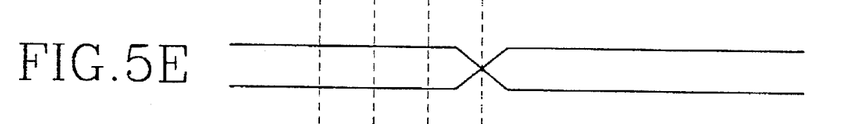
Figure 5F:
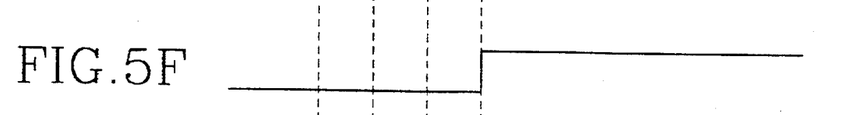

Thereafter, the data stabilizing circuit 50, that is, the Schmitt trigger 50a, receives the data signal having the high or low level voltage, which is outputted from the commonly connected output terminals between the PMOS transistor Q10 and the NMOS transistor Q11 and stabilizes the data signal, as shown in FIG. 5E. Meanwhile, the output buffer 60 is enabled by the fourth control signal CS4 having a high level voltage outputted from an externally connected element and outputs the data signal from the Schmitt trigger 50a out of the memory as DATA OUT.

Figure 6:
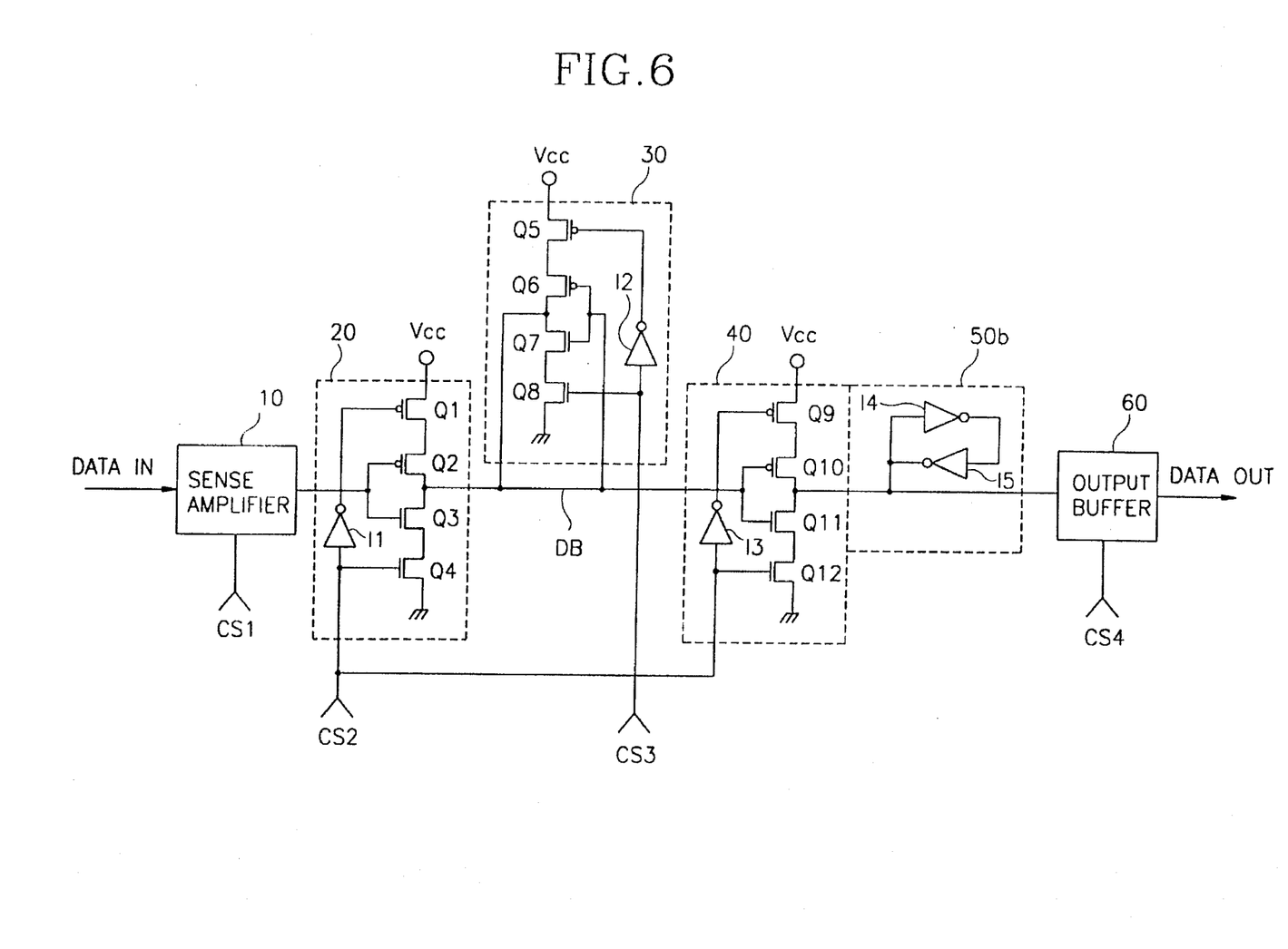
FIG. 6 is a block diagram of a data transmission apparatus for a memory according to a second embodiment of the present invention.

As shown in FIG. 6, there is shown a data transmission apparatus for a memory according to a second embodiment of the present invention. In the second embodiment, the data stabilizing circuit 50 of the first embodiment, i.e., the Schmitt trigger 50a, is replaced with a direct current latch 50b. Because the remaining construction of the second embodiment is the same as that of the first embodiment, the description thereof is omitted except the description of the direct current latch 50b.

In the direct current latch 50b, the input terminal of the inverter I4 and the output terminal of the inverter I5 are commonly connected to the commonly connected output terminals between the PMOS transistor Q10 and the NMOS transistor Q11 in the second inverter 40. Thus, the output terminal of the inverter I4 is connected to the input terminal of the inverter I5 to perform the same operation as the Schmitt trigger 50a of the first embodiment.

The construction of the data transmission apparatus for a memory according to a third embodiment of the present invention will now be explained with reference to FIG. 7.

Figure 7:
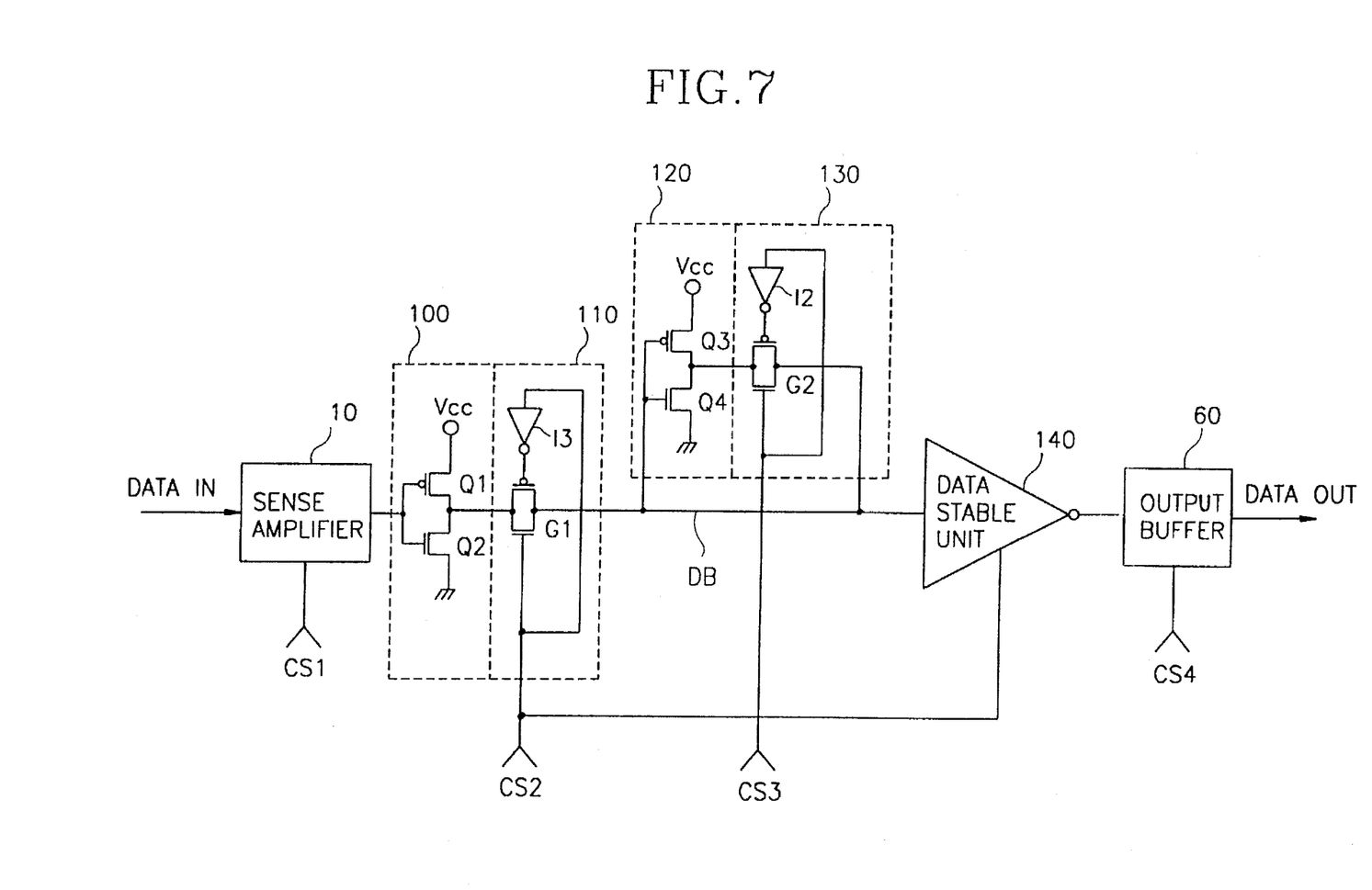
FIG. 7 is a block diagram of a data transmission apparatus for a memory according to a third embodiment of the present invention.

As shown in FIG. 7, the data transmission apparatus for a memory includes a sense amplifier 10 for amplifying data DATA IN after it is enabled by a first control signal CS1 inputted from an externally connected element. A first inverter 100 inverts data outputted from the sense amplifier 10, and a first switching circuit 110, which is controlled by a second control signal CS2 applied thereto from an externally connected element, outputs the data outputted from the first inverter to a data bus DB. A second inverter 120 inverts the data outputted from the data bus DB, and a second switching circuit 130, which is controlled by a third control signal CS3 applied thereto from an externally connected element, outputs the data outputted from the second inverter 120 to the data bus DB. A data stabilizing circuit 140 stabilizes the data outputted from the data bus DB after it is enabled by the second control signal CS2 applied to the first switching circuit 110. An output buffer 60 temporarily stores the data outputted from the data stabilizing circuit 140 and outputs the temporarily stored data as DATA OUT.

The operation of the data transmission apparatus of a memory according to the third embodiment of the present invention will now be explained with reference to FIG. 5.

Initially, as shown in FIG. 5A, the sense amplifier 10 is disabled by the first control signal CS1 having a low level voltage for a predetermined time t4 and cuts off the data DATA IN inputted thereto. In addition, in the first switching circuit 110, the second control signal CS2 having a low level voltage, shown in FIG. 5B, is applied to the NMOS terminal of the transmission gate G1 for a predetermined time t4, and a high level voltage outputted by the inverter I3 is applied to the PMOS terminal of the transmission gate G1. Hence, the transmission gate G1 is turned off. In addition, the data stabilizing circuit 140 is disabled by the second control signal CS2 having the low level voltage which is applied to the first switching circuit 110.

Meanwhile, as shown in FIG. 5C, the third control signal CS3 having a high level voltage is applied to the NMOS terminal of the transmission gate G2 for a predetermined time t4, and a low level voltage, which is outputted by the inverter I2, is applied to the PMOS terminal of the transmission gate G2. Hence, the transmission gate G2 is turned on. In the second switching circuit 120, the data signal outputted from the commonly connected output terminals between the PMOS transistor Q3 and the NMOS transistor Q4 is applied to the data bus DB through the transmission gate G2. The data signal applied to the data bus DB feeds back and is commonly applied to the gate terminals of the PMOS transistor Q3 and the NMOS transistor Q4.

The operation is repeatedly performed, and the data in the data bus DB is precharged in a form of a mid-level voltage as described in the first and second embodiments of the present invention. Thereafter, as shown in FIG. 5A, the first control signal CS1 having a high level voltage is applied to the sense amplifier 10 for a predetermined time t5, and the sense amplifier 10 amplifies the data DATA IN inputted thereto by a predetermined level. When the data outputted from the sense amplifier 10 has a high level voltage, the PMOS transistor Q1 of the first inverter 100 is turned off, and the NMOS transistor Q2 of the first inverter 100 is turned on. Then, the data signal having a low level voltage is outputted from the commonly connected output terminals between the PMOS transistor Q1 and the NOS transistor Q2. Alternatively, when the data signal outputted from the detection amplifying circuit 10 has a low level voltage, the PMOS transistor Q1 of the first inverter 100 is turned on, and the NOS transistor Q2 of the first inverter 100 is turned off. Then, the data signal outputted from the commonly connected terminals between the PMOS transistor Q1 and the NOS transistor Q2 is cut off by the transmission gate G1 since CS2 is still at a low level. Hence, the data signal having a mid-level voltage as shown in FIG. 5D is outputted from the data bus DB.

As shown in FIG. 5A, the first control signal CS1 having a high level voltage is applied to the detection amplifying circuit 10 for a predetermined time t6, the detection amplifying circuit 10 amplifies the data DATA IN. The first inverter 100 inverts the data signal outputted from the detection amplifying circuit 10, and the second inverter 120 inverts the data signal outputted from the data bus DB.

Meanwhile, as shown in FIG. 5C, when the transmission gate G2 in the second switching circuit 130 is cut off for a predetermined time t6, the data signal from the second inverter 120 is being controlled by the third control signal CS3 having a low level voltage. The data signal of the data bus DB begins transforming from the mid-level voltage, as shown in FIG. 5D.

The data stabilizing circuit 140 stabilizes the data signal outputted from the data bus DB in accordance with the second control signal CS2 having a high level voltage which is applied to the first switching circuit 110. The above described stabilized data signal DATA OUT is outputted from the output buffer 60.

As described above, the data transmission apparatus according to the present invention transmits the data previously stored in a memory at a high speed by reducing the delay time of "t5+t6" which is caused when the data previously stored in a memory cell to the outside of the memory by precharging the data bus before the data signal is transmitted to the data bus and reducing the data transmission time in the data bus.

It will be apparent to those skilled in the art that various modifications and variations can be made in a data transmission apparatus for a memory of the present invention without departing from the spirit or scope of the invention. Thus, it is intended that the present invention cover the modifications and variations of this invention provided they come within the scope of the appended claims and their equivalents.

What is claimed is:

1. A data transmission apparatus for a memory, comprising:

precharging means for precharging a data bus, the precharging means being enabled by a first control signal outputted from a first externally connected element before data is transmitted to the data bus;

a first inverter for inverting data applied thereto and for transmitting the inverted data to the data bus, the first inverter being enabled by a second control signal outputted from a second externally connected element when the precharging of the data bus by the precharging means is completed;

a second inverter for inverting the data transmitted to the data bus by the first inverter, the second inverter being enabled by the second control signal; and data stabilizing means for stabilizing the data inverted by the second inverter and for transmitting the stabilized data to a third externally connected element.

2. The apparatus of claim 1, wherein the precharging means comprises:

a first PMOS transistor having a gate terminal connected to an output terminal of a third inverter, and a source terminal connected to a power voltage terminal;

a second PMOS transistor and a first NMOS transistor, a gate terminal of the second PMOS transistor and a gate terminal of the first NMOS transistor being commonly connected to the data bus, a source terminal of the second PMOS transistor being connected to a drain terminal of the first PMOS transistor, and a drain terminal of the second PMOS transistor and a drain terminal of the first NMOS transistor being commonly connected to the data bus; and a second NMOS transistor having a gate terminal connected to an input terminal of the third inverter, a drain terminal connected to a source terminal of the first NMOS transistor, and a source terminal connected to a ground.

3. The apparatus of claim 1, wherein the data stabilizing means comprises a Schmitt trigger.

4. The apparatus of claim 1, wherein the data stabilizing means comprises a current latch.

5. A data transmission apparatus for a memory, comprising:

a first inverter for inverting inputted data before the inputted data is transmitted to a data bus;

first switching means, switched by a first control signal outputted from a first externally connected element, for transmitting the data inverted by the first inverter to a second inverter;

second switching means, switched by a second control signal outputted from a second externally connected element, and for transmitting data outputted from the second inverter to the data bus, the second switching means and the second inverter precharging the data bus; and data stabilizing means, coupled to the second switching means and enabled by the first control signal, for transmitting data to a third externally connected element by stabilizing data outputted from the data bus.

6. A data transmission apparatus for transmitting data from a memory to an externally connected element along a data bus, comprising:

precharging means for precharging the data bus;

first inverting means for inverting the data upon completion of the precharging of the data bus by the precharging means; and second inverting means for inverting the data inverted by the first inverting means;

wherein the precharging means comprises:

a first PMOS transistor having a gate terminal connected to an output terminal of a third inverter, and a source terminal connected to a power voltage terminal;

a second PMOS transistor and a first NMOS transistor, a gate terminal of the second PMOS transistor and a gate terminal of the first NMOS transistor being commonly connected to the data bus, a source terminal of the second PMOS transistor being connected to a drain terminal of the first PMOS transistor, and a drain terminal of the second PMOS transistor and a drain terminal of the first NMOS transistor being commonly connected to the data bus; and a second NMOS transistor having a gate terminal connected to an input terminal of the third inverter, a drain terminal connected to a source terminal of the first NMOS transistor, and a source terminal connected to ground.

* * * * *